(12) United States Patent
Snoeij et al.

(10) Patent No.: US 8,390,379 B2
(45) Date of Patent: Mar. 5, 2013

(54) AMPLIFIER INPUT STAGE AND SLEW BOOST CIRCUIT

(75) Inventors: Martijn Fridus Snoeij, Nuremberg (DE); Sergey Alenin, Tucson, AZ (US); Margarita Alenina, legal representative, Tucson, AZ (US)

(73) Assignee: Texas Instruments Deutschland GmbH, Freising (DE)

( * ) Notice: Subject to any disclaimer, the term of this patent is extended or adjusted under 35 U.S.C. 154(b) by 56 days.

(21) Appl. No.: 12/916,404

(22) Filed: Oct. 29, 2010

(65) Prior Publication Data

US 2012/0086509 A1   Apr. 12, 2012

Related U.S. Application Data

(60) Provisional application No. 61/391,941, filed on Oct. 11, 2010.

(51) Int. Cl.
*H03F 3/45* (2006.01)
(52) U.S. Cl. ........................................ 330/257; 330/261
(58) Field of Classification Search .................. 330/252, 330/257, 260, 261
See application file for complete search history.

(56) References Cited

U.S. PATENT DOCUMENTS

| 6,437,645 | B1  |   | 8/2002  | Ivanov et al. |         |
|-----------|-----|---|---------|---------------|---------|
| 6,965,266 | B1  | * | 11/2005 | Can           | 330/252 |
| 7,176,760 | B2  | * | 2/2007  | Jones         | 330/253 |
| 7,436,262 | B2  | * | 10/2008 | Ashby et al.  | 330/254 |
| 7,557,659 | B2  | * | 7/2009  | Harvey        | 330/255 |
| 7,791,414 | B1  | * | 9/2010  | van Sprakelaar| 330/257 |

* cited by examiner

*Primary Examiner* — Henry Choe
(74) *Attorney, Agent, or Firm* — Alan A. R. Cooper; Wade J. Brady, III; Frederick J. Telecky, Jr.

(57) ABSTRACT

Various apparatuses, methods and systems for boosting an amplifier slew rate are disclosed herein. For example, some embodiments of the present invention provide an apparatus including a pair of inputs connected to a pair of differential input devices in an amplifier, a current source, a first current path connected to the current source, a second current path connected to the current source and to the pair of differential input devices, a switch in the first current path, and a voltage difference signal connected between the pair of inputs and the switch. The voltage difference signal represents the voltage difference between the pair of inputs. The conductance of the switch is inversely proportional to the voltage difference signal.

6 Claims, 3 Drawing Sheets

US 8,390,379 B2

AMPLIFIER INPUT STAGE AND SLEW BOOST CIRCUIT

CROSS REFERENCE TO RELATED APPLICATION

The present application claims priority to (i.e., is a non-provisional of) U.S. Provisional Patent Application No. 61/391,941 entitled "Amplifier Input Stage and Slew Boost Circuit", and filed Oct. 11, 2010 by Snoeij et al. The aforementioned application is assigned to an entity common hereto, and the entirety of the aforementioned application is incorporated herein by reference for all purposes.

BACKGROUND

Amplifiers are used to increase the strength or amplitude of an electrical signal. One common type of amplifier is an operational-amplifier (op-amp), a high-gain voltage amplifier having a pair of differential inputs and an output. The op-amp amplifies the difference between the voltages at the inputs by a factor of hundreds or thousands and presents the amplified difference at the output. Op-amps may be connected in a number of circuit configurations to control the gain and to perform various functions.

When designing an op-amp, a trade-off exists between the amplifier's noise-to-power ratio and its slew rate. The noise-to-power ratio is the ratio of noise performance, noise generated by the op-amp, to power consumption, the power consumed by the op-amp. Transistors in the input differential stage op-amp are the main contributors to noise in the op-amp. To minimize noise, their transconductance ($g_m$), the ratio of output current change to input voltage change, needs to be maximized, while keeping the bias current and thus overall power consumption as low as possible. For junction field-effect transistor (JFET) and metal-oxide-semiconductor field-effect transistor (MOSFET) input devices, this is done by ensuring that they operate in weak-inversion, where their $g_m$/drain current ($g_m/I_d$) ratio is as high as possible. Because the amplifier needs to be stable, Miller compensation is typically applied, increasing the input capacitance and reducing the bandwidth of the op-amp. The required size of the Miller capacitor is mainly determined by the $g_m$ of the input stage, as the dominant pole is determined by $g_m/C_{Miller}$. Thus, a choice for a low noise design implies high $g_m$, and thus requires a large Miller capacitor.

The slew rate of the op-amp, the maximum rate of change in the output voltage, is generally determined by the ratio of the tail current ($2*I_d$) and the Miller capacitor. As outlined above, a power-efficient low-noise design leads to a large Miller capacitor and a relatively low drain current. Thus, such a low noise design will have a poor slew-rate for given tail current and power consumption. A need therefore remains for an amplifier having a power-efficient low-noise amplifier with a high slew rate.

BRIEF SUMMARY

Various apparatuses, methods and systems for boosting an amplifier slew rate are disclosed herein. For example, some embodiments of the present invention provide an apparatus including a pair of inputs connected to a pair of differential input devices in an amplifier, a current source, a first current path connected to the current source, a second current path connected to the current source and to the pair of differential input devices, a switch in the first current path, and a voltage difference signal connected between the pair of inputs and the switch. The voltage difference signal represents the voltage difference between the pair of inputs. The conductance of the switch is inversely proportional to the voltage difference signal. In some embodiments, the second current path is connected to the pair of differential input devices through a current mirror. As the voltage difference increases, the switch conductance is reduced and more current from the current source is steered through the second current path, increasing a tail current through the pair of differential input devices to boost the slew rate. The first and second current paths may be a part of a translinear loop.

Other embodiments of the present invention provide a method for boosting slew rate in an amplifier input stage. The method includes determining a voltage difference between a pair of input voltages to an amplifier, generating a constant current, and steering the constant current from a first circuit path to a second circuit path. The tail current level through a pair of input devices in the amplifier is set in proportion to the current level through the second circuit path. As the difference between the maximum voltage and minimum voltage increases, the constant current is steered increasingly through the second circuit path rather than the first, and the tail current level through the pair of input devices is also increased. The determination of voltage difference and the constant current steering may comprise determining a maximum voltage and a minimum voltage of the pair of input voltages, and using the maximum voltage and the minimum voltage to set the base and emitter voltages of a transistor in the first circuit path. In some embodiments, the pair of input devices are in the second circuit path. In other embodiments, the current through the second circuit path is applied to the pair of input devices through a current mirror. In some cases, the current mirror amplifies the current through the second circuit path so that the tail current through the pair of input devices is proportional to but greater than the current through the second circuit path. During rapid slewing conditions, the constant current may be entirely steered through the second circuit path, maximizing the tail current level. The maximum value of the tail current level may be set at least in part by a level of the constant current.

This summary provides only a general outline of some embodiments according to the present invention. Many other objects, features, advantages and other embodiments of the present invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals may be used throughout several drawings to refer to similar components.

DETAILED DESCRIPTION

Figure 1:
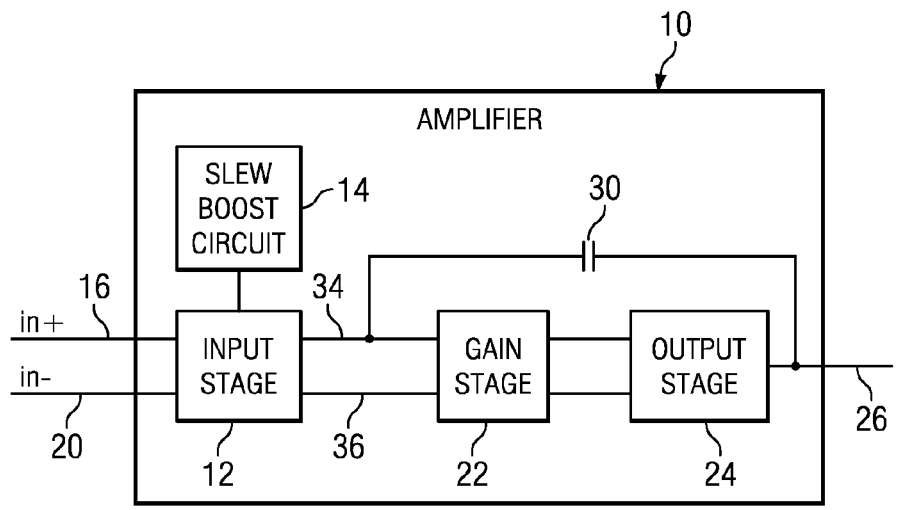
FIG. 1 depicts a block diagram of an amplifier including an input stage and slew boost circuit in accordance with some embodiments of the present invention.

The drawings and description, in general, disclose various embodiments of an amplifier input stage and slew boost circuit. The amplifier input stage and slew boost circuit disclosed herein may be applied in any type of op-amp and may be adapted for a variety of purposes. As an example, a general block diagram of an amplifier 10 such as an op-amp is illustrated in FIG. 1 in accordance with some embodiments of the present invention. The amplifier 10 includes an input stage 12 and slew boost circuit 14 connected together to process a pair of inputs, such as a non-inverting input 16 and an inverting input 20. The input stage 12 amplifies the voltage difference between the inputs 16 and 20. The slew boost circuit 14 increases the current through the input stage 12 during a slewing condition, when a voltage difference exists between the inputs 16 and 20. The increased current in the input stage 12 due to the slew boost circuit 14 increases the slew rate of the amplifier 10 when it is needed, then lowers the current through the input stage 12 to reduce power consumption when the op-amp is not slewing. During normal or quiescent operation of an op-amp, the high voltage gain of an op-amp along with an external feedback loop ensures that the inputs 16 and 20 are at the same voltage level. The op-amp is typically only in a slewing condition temporarily when a differential signal applied to the inputs 16 and 20 forces them apart, and then only until the op-amp output changes and the external feedback loop brings the inputs 16 and 20 back together. Because the op-amp is not normally in a slewing condition, power consumption is reduced by applying the slew boost only when needed. As will be described in more detail below, the slew boost circuit 14 increases the current through the input stage 12 in a highly linear manner, avoiding harmonic distortion. The input stage 12 drives a gain stage 22, which in turn drives an output stage 24 to produce an output 26. In some embodiments, one or more Miller compensation capacitors 30 may be connected in the amplifier 10 to increase stability. For example, a Miller compensation capacitor 30 may be connected between the negative output 36 of the input stage 12 and the output 26 of the amplifier 10, although the Miller compensation capacitor 30 is not limited to this location. Again, although the use of the input stage 12 and slew boost circuit 14 is illustrated in a generic differential amplifier 10, they are not limited to use in any particular type or configuration of amplifier and may be used and adapted as desired for other applications. The slew boost circuit 14 disclosed herein has a very linear response and a well-defined maximum slew boost factor. This makes it very suitable for high-end audio amplifiers, as well as other applications in which low harmonic distortion and low noise are beneficial or even essential.

Before continuing to describe the input stage 12 and slew boost circuit 14, brief definitions of some of the terms used throughout this specification will be given. The terms "connected" or "coupled" and related terms are used in an operational sense and are not necessarily limited to a direct connection or coupling. The phrases "in one embodiment," "according to one embodiment," and the like generally mean the particular feature, structure, or characteristic following the phrase is included in at least one embodiment of the present invention, and may be included in more than one embodiment of the present invention. Importantly, such phases do not necessarily refer to the same embodiment. If the specification states a component or feature "may", "can", "could", or "might" be included or have a characteristic, that particular component or feature is not required to be included or have the characteristic.

Figure 2:
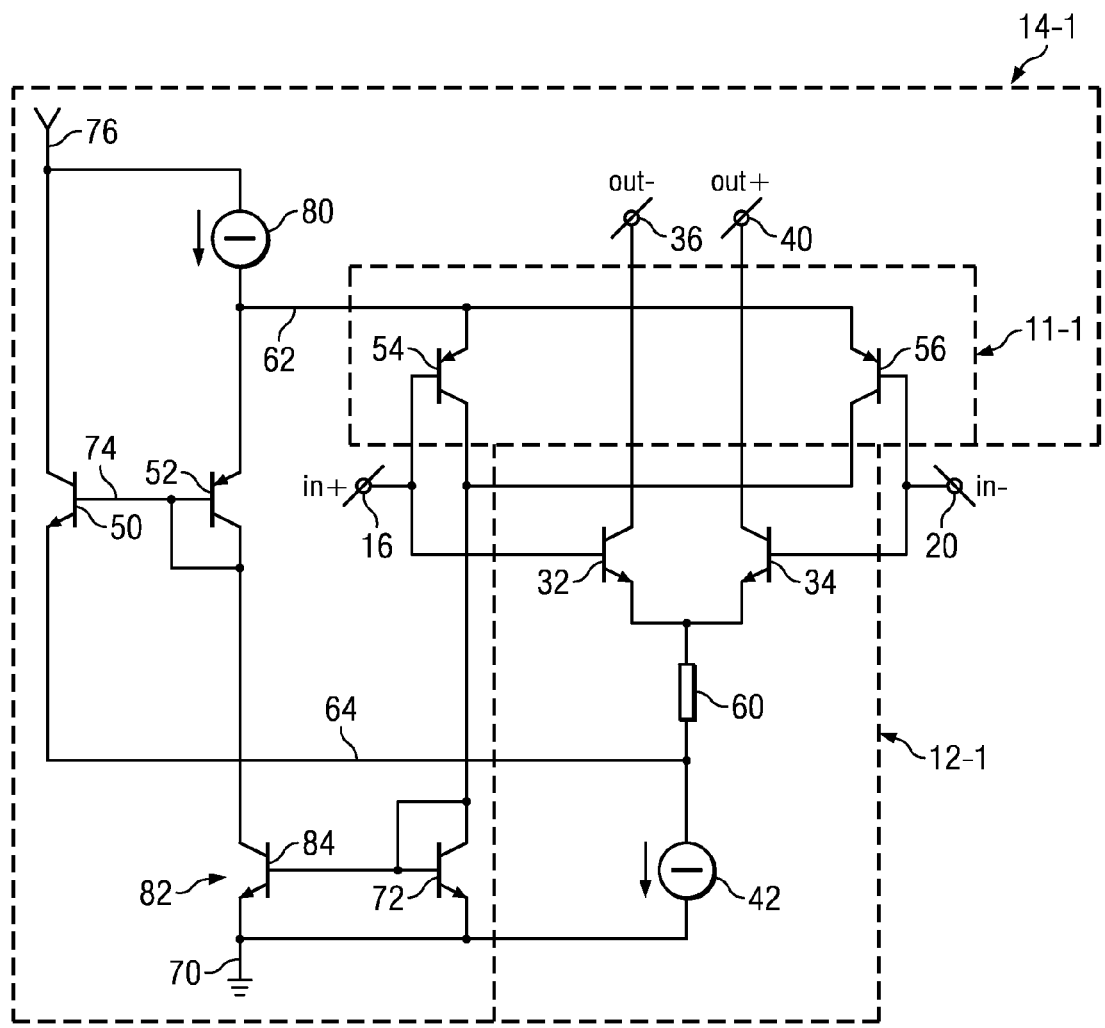
FIG. 2 depicts an amplifier input stage and slew boost circuit with bipolar junction transistor (BJT) input devices in accordance with some embodiments of the present invention.

Turning now to FIG. 2, an example of an input stage 12 and slew boost circuit 14 (which, for FIG. 2 are labeled 12-1 and 14-1) using BJT input devices is illustrated. A differential pair of NPN BJT transistors 32 and 34 are driven by the inputs 16 and 20. The non-inverting input 16 is connected to the base of transistor 32, the inverting input 20 is connected to the base of transistor 34. The collector of transistor 32 is connected to the negative output 36 of the input stage 12-1, the collector of transistor 34 is connected to the positive output 40 of the input stage 12-1, with outputs 36 and 40 feeding to the gain stage 22 or other elements of the amplifier 10. A tail current source 42 provides a tail current for the differential input transistors 32 and 34. When a differential signal is applied to the inputs 16 and 20, that is, when the voltage at one of the inputs (e.g., 16) is higher than the voltage at the other input (e.g., 20), one of the transistors (e.g., 32) conducts more of the tail current than the other (e.g., 34). At some point with a large and rapidly changing differential signal, all of the available tail current will flow through just one of the input transistors (e.g., 32).

With the Miller compensation capacitor 30 connected to one of the outputs 36 or 40 for stability in the amplifier 10, the tail current flows into the Miller compensation capacitor 30, limiting the slew rate. If the tail current is increased to increase the slew rate, the $g_m$, of the differential input transistors 32 and 34 is also increased. To maintain the bandwidth of the amplifier 10, the Miller compensation capacitor 30 would then also have to be increased, negating the effect of the increased tail current on the slew rate. Similarly, if the designer would like to increase the bandwidth of the amplifier 10, the Miller compensation capacitor 30 is made smaller, and the current in the output stage must be increased in order to keep the amplifier stable, increasing the power consumption in the amplifier 10. The amplifier 10 and input stage 12-1 disclosed herein maintains low power consumption with a relatively small tail current in the input stage 12-1, increasing the tail current only when a differential voltage is applied to the differential input transistors 32 and 34. The slew boost circuit 14-1 applies the tail current increase gently to the input stage 12-1, preventing harmonic distortion.

The tail current source 42 is adapted to provide a constant tail current at the highest desired slew-boosting level. For example, in one embodiment, the tail current source 42 is generates a constant current of about 580 µA. The slew boost circuit 14-1 includes a feedback loop that steals current from the tail current source 42 through transistor 50 in a first circuit path during normal (non-slewing) operation, limiting tail current through the differential input transistors 32 and 34 to normal levels, for example to about a tenth of the constant current from the tail current source 42. During slewing conditions, the tail current from the tail current source 42 stolen by transistor 50 in the first circuit path is reduced or eliminated, increasing the tail current through one or both of the differential input transistors 32 and 34 in a second circuit path. The feedback loop in the slew boost circuit 14-1 includes transistors 50, 52, 54 and 56. In some embodiments, the feedback loop with transistors 50, 52, 54 and 56 and the differential input transistors 32 and 34 form a translinear loop, a current-mode circuit that includes transistors that operate with an exponential current-voltage relationship. Transistors 54 and 56 (which generally for a differential pair of transistors) also can form a control circuit 11-1 as part of circuit 14-1. Additionally, as shown, current mirrors are formed by transistors 50 and 52 and transistors 72 and 84.

The translinear loop in the input stage 12-1 and slew boost circuit 14-1 is controlled by two voltages, the minimum (or lower) and the maximum (or higher) of the two input voltages at the differential input transistors 32 and 34. The minimum of the two input voltages is tracked at node 62, and the maximum of the two input voltages is tracked at node 64. The minimum voltage at node 62 sets the base voltage $V_B$ of tail current stealer transistor 50, and the maximum voltage at node 64 sets the emitter voltage $V_E$ of transistor 50. Thus, when the minimum voltage at node 62 falls and/or the maximum voltage at node 64 rises during slewing, the base-emitter voltage $V_{BE}$ of transistor 50 falls, reducing the portion of the tail current from tail current source 42 stolen through transistor 50.

Node 62 tracks the minimum of the voltages at the two inputs 16 and 20 using transistors 54 and 56. In the example embodiment of FIG. 2, transistors 54 and 56 are PNP BJT transistors, with common emitters connected to node 62 and common collectors connected to ground 70 through a diode-connected transistor 72. The base of transistor 54 is connected to the non-inverting input 16, and the base of transistor 56 is connected to the inverting input 20. The transistor 54 or 56 with the lower base voltage will conduct more current. For example, if inverting input 20 has a lower voltage than non-inverting input 16, the voltage at the base of the transistor 56 connected to the inverting input 20 is lower than the voltage at the base of the transistor 54 connected to the non-inverting input 16. The transistor 56 therefore conducts more current than transistor 54. If the differential voltage between the inputs 16 and 20 is great enough, all of the current through node 62 will flow through the transistor 56 with the lowest base voltage, and the other transistor 54 will be turned off. With only the base-emitter junction of the conducting transistor 56 between the inverting input 20 and node 62, node 62 tracks the minimum input voltage, plus the $V_{BE}$ of the conducting transistor 56.

Node 64 tracks the maximum of the voltages at the two inputs 16 and 20. The input 16 or 20 having the higher voltage turns on its associated input transistor 32 or 34 more fully with a higher base voltage. This causes the input transistor 32 or 34 with the higher base voltage to steal the tail current from the tail current source 42 away from the input transistor 32 or 34 with the lower base voltage. For example, if non-inverting input 16 has a higher voltage than inverting input 20, the voltage at the base of the transistor 32 connected to the non-inverting input 16 is higher than the voltage at the base of the transistor 34 connected to the inverting input 20. The transistor 32 therefore conducts more current than transistor 34, stealing the tail current from the tail current source 42 which is connected between node 64 and ground 70. If the differential voltage between the inputs 16 and 20 is great enough, all of the tail current from the tail current source 42 will flow through that input transistor 32 with the higher base voltage. This high differential voltage state is also when the input stage 12-1 is slewing most rapidly, and this is when the slew boost circuit 14-1 needs to increase the slew rate. Thus, node 64 will be equal to the maximum input voltage, minus the $V_{BE}$ of the conducting differential input transistor 32 or 34 and the voltage drop across the resistor 60, tracking the maximum input voltage (with a small offset) during the rapid slewing state.

The minimum voltage at node 62 is carried to the base of transistor 50 at node 74 through diode-connected PNP BJT transistor 52, reversing the $V_{BE}$ offset between node 62 and the lower input (e.g., 20). The emitter of transistor 52 is connected to node 62, and the base and collector of transistor 52 is connected to the base of transistor 50. Thus, node 74 tracks the minimum voltage at input 16 or 20, without the $V_{BE}$ offset. As node 62 falls due to a falling voltage at one of the differential inputs 16 and 20, node 74 falls as well, tracking the minimum input voltage. The PNP transistor 52 is used between nodes 62 and 74 to complete the translinear loop with one $V_{BE}$ voltage drop between nodes 62 and 74.

The collector of transistor 50 is connected to a voltage source 76, and the emitter is connected to node 64. The current through NPN BJT transistor 50 is reduced either by a rising voltage at node 64 which raises the $V_E$ and thus reduces the $V_{BE}$ of transistor 50, or by a falling voltage at node 62 which lowers the $V_B$ and thus reduces the $V_{BE}$ of transistor 50. ($V_{BE} = V_{node\ 74} - V_{node\ 64}$) With either or both a falling minimum input voltage and/or rising maximum input voltage, the $V_{BE}$ of transistor 50 is reduced, lowering the current through transistor 50 and steering more of the tail current through one or both differential input transistors 32 and 34. In this way, when the inputs 16 and 20 are slewing, more of the tail current from tail current source 42 is steered away from transistor 50 and through the differential input transistors 32 and 34 to increase the slew rate of the input stage 12-1. Because of the exponential behavior of bipolar transistor 50, a voltage difference between inputs 16 and 20 of a few hundred mV or more will result in virtually all of the current from tail current source 42 being steered through the differential input transistors 32 and 34.

Current source 80 is connected between voltage source 76 and node 62 and provides a constant current which is divided between transistors 54 and 56 on one side and transistor 52 on the other. In some embodiments, current source 80 provides a current of about 140 μA, although it is not limited to this value. Note that as the voltage at node 62 falls, the $V_{BE}$ of PNP BJT transistor 52 falls which turns it on more fully and would tend to increase the proportion of the current from current source 80 that flows through transistor 52. This would counteract the effect of the falling voltage of node 62 on the base of transistor 50. To prevent this, a current mirror 82 made up of diode-connected NPN BJT transistor 72 and NPN BJT transistor 84 evenly divides the current from current source 80 through transistor 52 and the combination of transistors 54 and 56. The base and collector of transistor 72 are connected to the base of transistor 84 and to the common collectors of transistors 54 and 56. The emitters of transistors 72 and 84 are connected to ground 70. The collector of transistor 84 is connected to the collector of transistor 52. With the current mirror 82, the tail current through transistors 54 and 56 is equal to the tail current through transistor 52, regardless of the changing $V_{BE}$ of transistor 52. The emitter area of transistor 52 may be set at 2× to carry the current which during normal operation is twice that carried by each of the transistors 54 and 56, thus ensuring that the base-emitter voltages of transistors 52, 54 and 56 are equal.

The ratio of the current through the transistor 50 and the differential input transistors 32 and 34 can be set at least in part by the relative emitter areas of the transistors 50, 32 and 34. If transistor 50 has a 10× emitter area and each of the differential input transistors 32 and 34 has an emitter area of 1× (for a combined emitter area of 2×), during normal operation 80% of the tail current runs through transistor 50 and 10% of the tail current runs through each input transistor 32 and 34. Note that during normal operation of an op-amp, the high voltage gain along with an external feedback network ensures that the inputs 16 and 20 are at the same voltage, causing the tail current to be split equally between the differential input transistors 32 and 34. With a tail current source 42 producing 580 μA, during normal operation each of the differential input transistors 32 and 34 carries a current of 580 μA/10 or 58 μA, and during full slewing one of the differential input transistors 32 or 34 carries the full 580 μA tail current. The slew boost circuit 14-1 gently increases the tail current through the input stage 12-1 in a substantially linear fashion as the voltage differential at the differential input transistors 32 or 34 increases, increasing from the 58 μA tail current in an input transistor 32 or 34 to the full 580 μA tail current. Again, the current level from the tail current source 42 is not limited to the example given herein, nor are the input stage 12-1 and slew boost circuit 14-1 limited to the 8:1:1 emitter area ratio of this example.

In some embodiments, a resistor 60 is connected between the common emitters of the differential input transistors 32 and 34 and the tail current source 42. Without the resistor 60, the tail current increase would be determined by the base-emitter voltages VBE of transistor 50 and of the differential input transistors 32 and 34, leading to an exponential (and thus non-linear) increase in current. Resistor 60 effectively degenerates differential input transistors 32 and 34, linearizing the tail current increase without the disadvantage of added differential noise. Any noise added by resistor 60 is common mode noise, and does not reflect on the differential signals. Thus the resistor 60 linearizes the slew boost without contributing to differential noise. Although the resistor 60 improves total harmonic distortion performance by several dB, the input stage 12-1 and slew boost circuit 14-1 disclosed herein perform well without the resistor 60 and are not limited to embodiments including the resistor 60.

Although the input stage 12-1 and slew boost circuit 14-1 work together and the boundaries between the two are not necessarily fixed, in one embodiment the input stage 12-1 includes the differential input transistors 32 and 34 and tail current source 42, and the slew boost circuit 14-1 includes transistors 50, 52, 54, 56, 72 and 84, resistor 60, and current source 80.

The input stage 12-1 and slew boost circuit 14-1 provide a low-power low-distortion amplifier input with an excellent slew rate. The increase in the tail current is applied to the input stage 12-1 gently and substantially linearly, and has a well-defined maximum increase set by the constant current level from tail current source 42.

Figure 3:
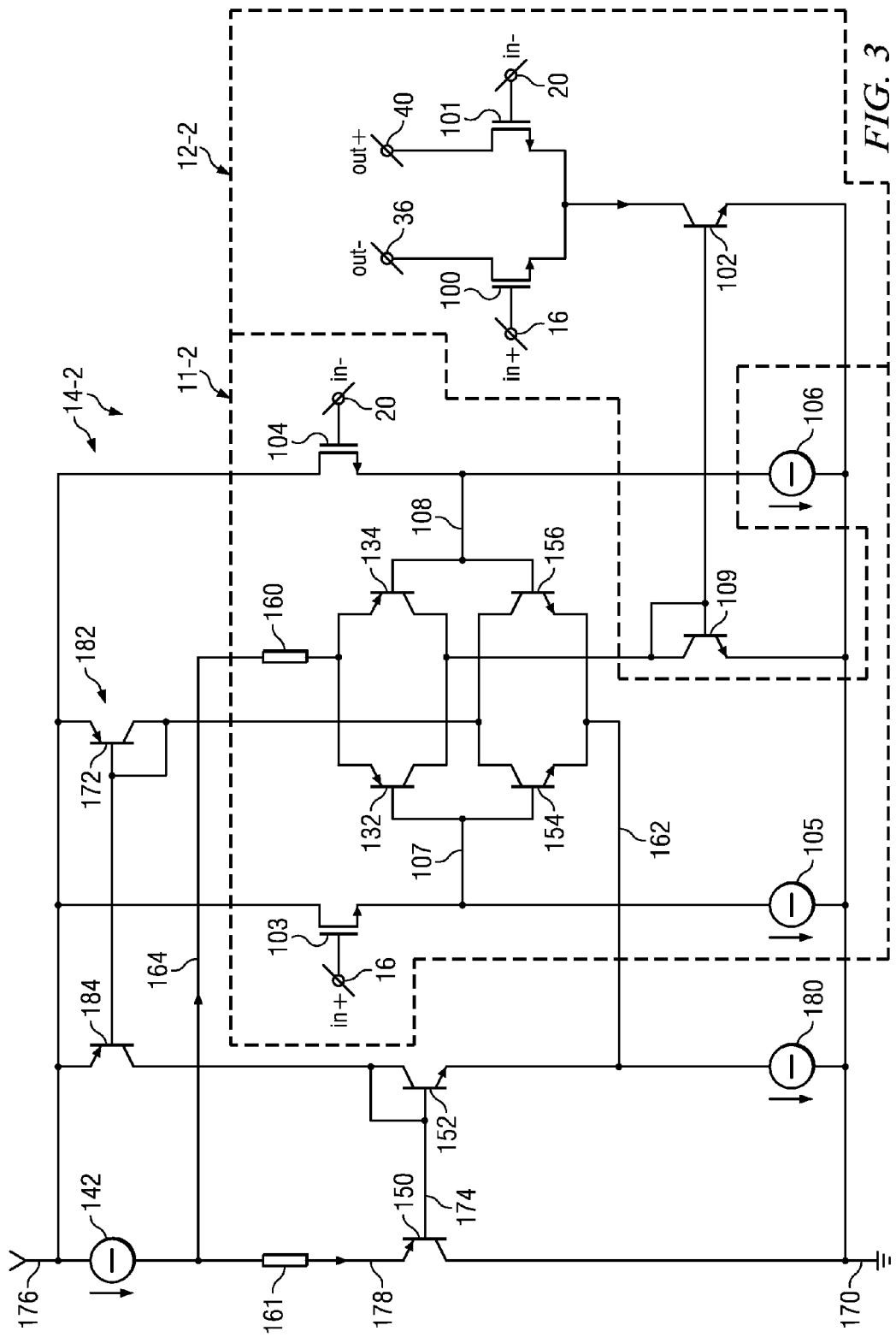
FIG. 3 depicts an amplifier input stage and slew boost circuit with JFET input devices in accordance with some embodiments of the present invention.

Turning now to FIG. 3, a JFET input stage 12-2 may be used with a slew boost circuit 14-2, providing for a low input bias current. In this embodiment, no bipolar transistors are directly connected to the input, in contrast to the bipolar transistors 32 and 34 of the embodiment of FIG. 2. In the embodiment of FIG. 3, a mix of bipolar and field effect transistors are used, taking advantage of the low input bias current behavior of a JFET input stage with the smaller size and better performance of bipolar transistors in the rest of the input stage 12-2 and slew boost circuit 14-2. In yet other embodiments, the input stage 12-2 and slew boost circuit 14-2 may be made exclusively of JFET transistors or other types of transistors or combinations of transistor types.

The input stage 12-2 in the embodiment illustrated in FIG. 3 includes a differential pair of N-channel JFET transistors 100 and 102. The gate of transistor 100 is connected to the non-inverting input 16 and the drain is connected to the negative output 36. The gate of transistor 101 is connected to the inverting input 20 and the drain is connected to the positive output 40. The sources of both differential input transistors 100 and 101 are connected to the collector of a current source NPN BJT transistor 102. Another pair of N-channel JFET source follower transistors 103 and 104 are used to buffer the inputs 16 and 20 for the translinear loop. The gate of transistor 103 is connected to the non-inverting input 16, the gate of transistor 104 is connected to the inverting input 20, the drains of the buffer transistors 103 and 104 are connected to a voltage source 176 and the sources are each connected to a bias current source 105 and 106. (Note that elements of FIG. 3 that are analogous to elements of FIG. 2 are numbered with an offset of 100.) The JFET transistors 100, 101, 103 and 104 are not placed directly into the translinear loop as in the embodiment of FIG. 2 because JFET transistors have a different transconductance than the bipolar transistors used elsewhere in the translinear loop. Node 107 at the source of transistor 103 is a buffered copy of non-inverting input 16, shifted by the $V_{GS}$ of transistor 103. Node 108 at the source of transistor 104 is a buffered copy of inverting input 20, shifted by the $V_{GS}$ of transistor 104. The remainder of the slew boost circuit 14-2 is very similar to that of the embodiment of FIG. 2, although the sense of the circuit is inverted, with PNP and NPN BJT transistors being swapped. Note that the sense of the embodiments of FIGS. 2 and 3 and of other embodiments may both be inverted as desired.

PNP BJT transistors 132 and 134 are analogous to NPN BJT transistors 32 and 34 of FIG. 2 and take their place in the translinear loop of FIG. 3. A current source 142 is connected between a voltage source 176 and the common emitters of transistors 132 and 134, and provides a current that is divided between transistors 132 and 134. The common collectors of transistors 132 and 134 are connected to the collector of a diode-connected NPN BJT transistor 109. Transistor 109 mirrors the current through transistors 132 and 134 through transistor 102 to provide a tail current for input transistors 100 and 101. The base of transistor 109 is connected to the base of transistor 102, and the emitters of transistors 109 and 102 are connected to ground 170. When a differential signal is applied to the inputs 16 and 20, that is, when the voltage at one of the inputs (e.g., 16) is higher than the voltage at the other input (e.g., 20), one of the transistors (e.g., 132) conducts more of the current than the other (e.g., 134). At some point with a large and rapidly changing differential signal, all of the available current will flow through just one of the input transistors (e.g., 132).

The current source 142 is adapted to provide a constant current that results in the highest desired slew-boosted tail current level through transistor 102 during slewing conditions. In some embodiments, as in FIG. 3, the current that is mirrored to the input stage 12-2 is amplified in the current mirror transistors 109 and 102 by a size ratio between the transistors 109 and 102 in the current mirror. For example, if transistor 109 is sized at 1× and transistor 102 at 20×, the current is amplified by a factor of 20. Thus, with a current source 142 producing 35 μA, at full slewing conditions the current through the input transistors 100 or 101 will be about 700 μA. The use of a current mirror ratio to amplify the current in the input stage 12-2 allows the slew boost circuit 14-2 to run at a much lower current than the input stage 12-2, resulting in lower power consumption.

The slew boost circuit 14-2 includes a feedback loop that steals current from the current source 142 through transistor 150 during normal (non-slewing) operation, limiting current through transistors 132 and 134 to normal levels. The emitter of PNP BJT transistor 150 is connected to the current source 142 and the collector is connected to ground 170. During slewing conditions, the current from the current source 142 stolen by transistor 150 is reduced or eliminated, increasing the current through one or both of transistors 132 and 134. The translinear loop in the slew boost circuit 14-2 includes transistors 132, 134, 150, 152, 154 and 156.

The translinear loop in the slew boost circuit 14-2 is controlled by two voltages, the minimum and the maximum of the two input voltages at inputs 16 and 20. The minimum of the two input voltages is tracked at node 164, and the maximum of the two input voltages is tracked at node 162. The maximum voltage at node 162 sets the base voltage $V_B$ of current stealer transistor 150, and the minimum voltage at node 164 sets the emitter voltage $V_E$ of transistor 150. Thus, when the minimum voltage at node 164 falls and/or the maximum voltage at node 162 rises during slewing, the base-emitter voltage $V_{BE}$ of transistor 150 falls, reducing the portion of the current from current source 142 stolen through transistor 150.

Node 162 tracks the maximum of the voltages at the two inputs 16 and 20 using NPN BJT transistors 154 and 156. The emitters of transistors 154 and 156 are connected to node 162, which is connected to the emitter of transistor 152 and to current source 180. The collectors of transistors 154 and 156 are connected to the voltage source 176 through diode-connected transistor 172. The base of transistor 154 is connected to node 107, and the base of transistor 156 is connected to node 108. The transistor 154 or 156 with the higher base voltage will conduct more current. For example, if inverting input 20 has a higher voltage than non-inverting input 16, the voltage at the base of the transistor 156 driven by the inverting input 20 is higher than the voltage at the base of the transistor 154 driven by the non-inverting input 16. The transistor 156 therefore conducts more current than transistor 154. If the differential voltage between the inputs 16 and 20 is great enough, all of the current through node 162 will flow through the transistor 156 with the highest base voltage, and the other transistor 154 will be turned off. With only the base-emitter junction of the conducting transistor 156 between node 162 and node 108 which follows the inverting input 20, node 162 tracks the maximum input voltage, minus the $V_{BE}$ of the conducting transistor 156 and the $V_{GS}$ of the buffer transistor 104.

Node 164 tracks the minimum of the voltages at the two inputs 16 and 20. The input 16 or 20 having the lower voltage turns on its associated transistor 132 or 134 more fully with a lower base voltage. This causes the transistor 132 or 134 with the lower base voltage to steal the current from the current source 142 away from the transistor 132 or 134 with the higher base voltage. For example, if non-inverting input 16 has a lower voltage than inverting input 20, the voltage at the base of the transistor 132 driven by the non-inverting input 16 is lower than the voltage at the base of the transistor 134 driven by the inverting input 20. The transistor 132 therefore conducts more current than transistor 134, conducting more of the current from the current source 142. If the differential voltage between the inputs 16 and 20 is great enough, all of the current from the current source 142 will flow through that input transistor 132 with the lower base voltage. This high differential voltage state is also when the input stage 12-2 is slewing most rapidly, and this is when the slew boost circuit 14-2 needs to increase the slew rate. Thus, node 164 will be equal to the minimum input voltage, plus the $V_{BE}$ of the conducting transistor 132 or 134 and the voltage drop across the resistor 160 and minus the $V_{GS}$ of buffer transistors 103 or 104, tracking the minimum input voltage (with a small offset) during the rapid slewing state.

The maximum voltage at node 162 is carried to the base of transistor 150 at node 174 through diode-connected NPN BJT transistor 152, plus the $V_{BE}$ of the conducting transistor 132 or 134. The emitter of transistor 152 is connected to node 162, and the base and collector of transistor 152 are connected to the base of transistor 150. Thus, node 174 tracks the maximum voltage at input 16 or 20, without the $V_{BE}$ offset. As node 162 rises due to a rising voltage at one of the differential inputs 16 and 20, node 174 rises as well, tracking the maximum input voltage.

The current through transistor 150 is reduced either by a falling voltage at node 164 which lowers the $V_E$ (node 178) and thus decreases the $V_{BE}$ of PNP BJT transistor 150, or by a rising voltage at node 162 which raises the $V_B$ (node 174) and thus decreases the $V_{BE}$ of transistor 150. ($V_{BE} = V_{node\ 174} - V_{node\ 178}$) With either or both a falling minimum input voltage and/or rising maximum input voltage, the $V_{BE}$ of transistor 150 is decreased, restricting the current through transistor 150 and steering more of the current through one or both transistors 132 and 134. In this way, when the inputs 16 and 20 are slewing, more of the current from current source 142 is steered away from transistor 150 and through transistors 132 and 134 to increase the slew rate of the input stage 12-2.

Current source 180 is connected between ground 170 and node 162 and provides a constant current which is divided between transistors 154 and 156 on one side and transistor 152 on the other. In some embodiments, current source 180 provides a current of about 20 µA, although it is not limited to this value. Note that as the voltage at node 162 rises, the $V_{BE}$ of NPN BJT transistor 152 falls which begins to turns it off and would tend to decrease the proportion of the current from current source 180 that flows through transistor 152. To prevent this, a current mirror 182 made up of diode-connected PNP BJT transistor 172 and PNP BJT transistor 184 evenly divides the current from current source 180 through transistor 152 and the combination of transistors 154 and 156. The base and collector of transistor 172 are connected to the base of transistor 184 and to the common collectors of transistors 154 and 156. The emitters of transistors 172 and 184 are connected to voltage source 176. The collector of transistor 184 is connected to the collector of transistor 152. With the current mirror 182, the current through transistors 154 and 156 is about equal to the current through transistor 152, regardless of the changing $V_{BE}$ of transistor 152. The emitter area of transistor 152 may be set at 2× to carry the current which during normal operation is twice that carried by each of the transistors 154 and 156, although the current ratios are set by the current mirror 182, not the relative emitter areas of transistors 152, 154 and 156.

The ratio of the current through the transistor 150 and the transistors 132 and 134 can be set at least in part by the relative emitter areas of the transistors 150, 132 and 134. If transistor 150 has a 5× emitter area and each of transistors 132 and 134 has an emitter area of 1× (for a combined emitter area of 2×), during normal or quiescent operation most of the current (25 µA of the 35 µA from current source 142) runs through transistor 150 and the remaining current (10 µA) runs through transistors 132 and 134. Note that during normal operation of an op-amp, the high voltage gain along with an external feedback network ensures that the inputs 16 and 20 are at the same voltage, causing the current to be split equally between transistors 132 and 134. During slewing, transistor 150 turns off and, with the example transistor dimensioning disclosed herein, the current in the input stage 12 rises 3.5 times to 700 µA. The slew boost circuit 14-2 gently increases the current through the input stage 12-2 in a substantially linear fashion as the voltage differential at the transistors 132 or 134 increases. Again, the current source 142 is not limited to the levels provided in the examples above, nor are the transistors dimensions limited to the examples provided above. Additionally, transistors 103, 104, 132, 134, 154, and 156 can form control circuit 11-2 as part of circuit 14-2.

In this embodiment, two linearization resistors 160 and 161 are included to slow down the otherwise exponential current increase through transistors 132 and 134. Resistor 160 is connected between the current source 142 and the common emitters of transistors 132 and 134. Resistor 161 is connected between the current source 142 and the emitter of transistor 150. Without at least one of the linearization resistors 160 and 161, the current increase would be determined by the base-emitter voltages VBE of transistor 150 and of transistors 132 and 134, leading to an exponential (and thus non-linear) increase in current. Resistors 160 and 161 effectively degenerate transistors 132 and 134 and current stealing transistor 150, linearizing the current increase without the disadvantage of added differential noise. Again, although linearizing resistors 160 and 161 improve total harmonic distortion performance, the input stage 12-2 and slew boost circuit 14-2 are not limited to use with linearizing resistors 160 and 161, and some embodiments of the input stage 12-2 and slew boost circuit 14-2 do not include them.

Several of the circuit elements described above are referred to elsewhere in this specification in alternative or more general terms. The node 164 is also referred to herein as a minimum input voltage signal, node 162 is also referred to as a maximum input voltage signal, and the two are also referred to collectively as a voltage difference signal. Transistors 132 and 134 are also referred to as minimum voltage detecting transistors. Transistors 154 and 156 are also referred to as maximum voltage detecting transistors.

Figure 4:
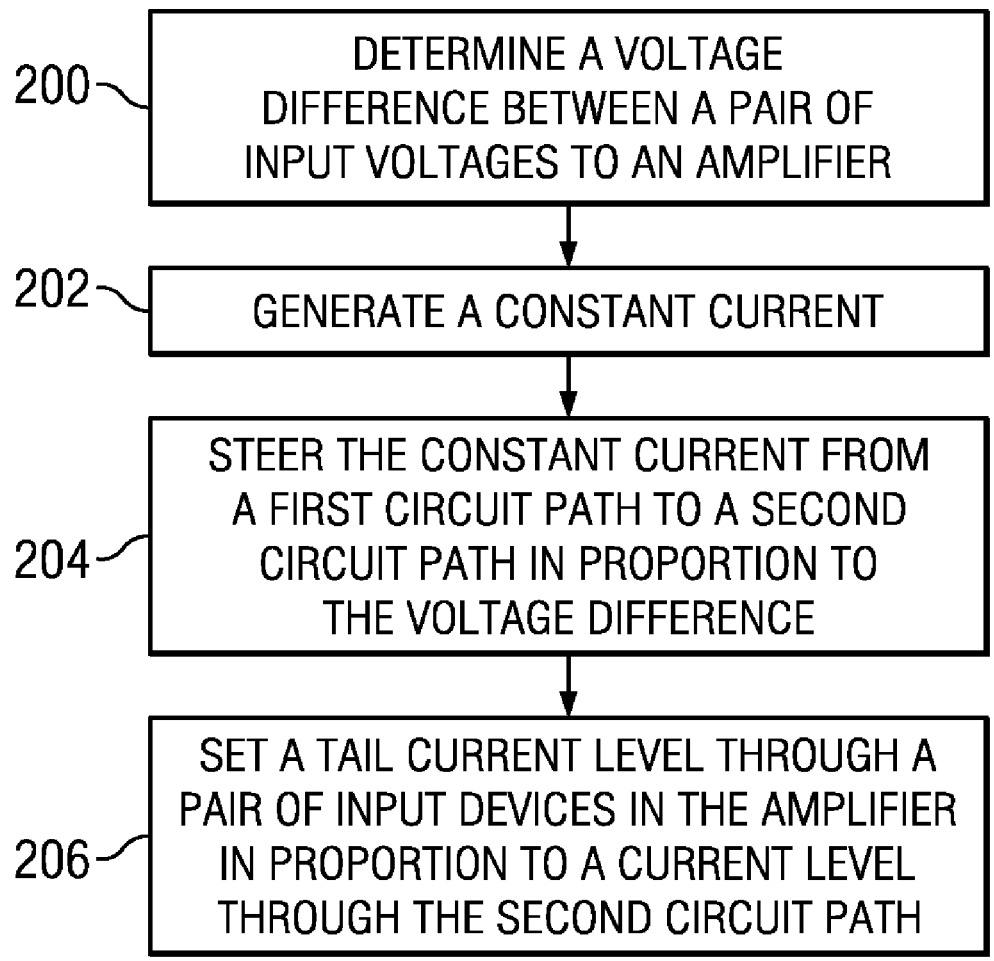
FIG. 4 depicts an operation for boosting slew rate in an amplifier input stage in accordance with some embodiments of the present invention.

Turning now to FIG. 4, a method for boosting slew rate in an amplifier input stage in accordance with some embodiments of the present invention includes determining a voltage difference between a pair of input voltages to an amplifier (block 200), generating a constant current (block 202), and steering the constant current from a first circuit path (e.g., through transistor 50 or 150) to a second circuit path (e.g., through differential input transistors 32 and 34 or through transistors 132 and 134) in proportion to the voltage difference (block 204). The tail current level through a pair of input devices in the amplifier is set in proportion to the current level through the second circuit path (block 206). As the difference between the maximum voltage and minimum voltage increases, the constant current is steered increasingly through the second circuit path rather than the first, and the tail current level through the pair of input devices is also increased. The determination of voltage difference and the constant current steering may comprise determining a maximum voltage and a minimum voltage of the pair of input voltages, and using the maximum voltage and the minimum voltage to set the base and emitter voltages of a transistor in the first circuit path. In some embodiments, as in the circuit of FIG. 2, the pair of input devices are in the second circuit path. In other embodiments, as in the circuit of FIG. 3, the current through the second circuit path is applied to the pair of input devices through a current mirror. In some cases, the current mirror amplifies the current through the second circuit path so that the tail current through the pair of input devices is proportional to but greater than the current through the second circuit path. During rapid slewing conditions, the constant current may be entirely steered through the second circuit path, maximizing the tail current level. The maximum value of the tail current level may be set at least in part by a level of the constant current.

The input stages 12 and 12-2 and slew boost circuits 14 and 14-2 disclosed provide a low-power, low-distortion amplifier input with an excellent slew rate. The slew boost circuits 14 and 14-2 have a very linear response and a well-defined maximum slew boost factor, making it very suitable for high-end audio amplifiers, as well as other applications in which low harmonic distortion and low noise are beneficial or even essential.

In conclusion, the present invention provides novel systems, devices, methods and arrangements for an amplifier input stage and slew boost circuit. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. An amplifier input stage and slew boost circuit comprising:
    a differential input pair of transistors connected to a pair of amplifier inputs;
    a constant current source;
    a pair of maximum voltage detecting transistors with control inputs connected to buffer transistor outputs, the pair of maximum voltage detecting transistors having a common input connected to the voltage source through an input of a first current mirror, the pair of maximum voltage detecting transistors having a common output connected to a second constant current source at a maximum input voltage node;
    a pair of minimum voltage detecting transistors with control inputs connected to the buffer transistor outputs, the pair of minimum voltage detecting transistors having a common input connected to the constant current source at a minimum input voltage node, the pair of minimum voltage detecting transistors having a common output connected to the differential input pair of transistors through a second current mirror;
    a diode-connected transistor connected between an output of the first current mirror and the second constant current source at a maximum input voltage node; and
    a transistor having a control input connected to a control input of the diode-connected transistor, an input connected to the constant current source at the minimum input voltage node, and an output connected to a ground, wherein a conductance of the transistor is inversely proportional to a difference between a voltage at the maximum input voltage node and a voltage at the minimum input voltage node.

2. The amplifier input stage and slew boost circuit of claim 1, wherein the transistor, the diode-connected transistor, the pair of maximum voltage detecting transistors, and the pair of minimum voltage detecting transistors form a translinear loop.

3. The amplifier input stage and slew boost circuit of claim 1, further comprising a degeneration resistor connected in series with the pair of minimum voltage detecting transistors.

4. An apparatus comprising:
    an input circuit having:
        a first input terminal;
        a second input terminal;
        a first differential pair of transistors that is coupled to the first and second input terminals; and
        a first current mirror that is coupled to the first differential pair of transistors;
    a slew boost circuit having:
        a first constant current source;
        a second constant current source;
        a control circuit having;
            a first transistor that is coupled to the first terminal at its control electrode;
            a third constant current source that is coupled to the first transistor;
            a second transistor that is coupled to the second terminal at its control electrode;
            a fourth constant current source that is coupled to the second transistor;

a second differential pair of transistors that is coupled to a first node between the first transistor and the third constant current source, a second node between the second transistor and the fourth current source, the first current mirror, and the first constant current source; and a third differential pair of transistors that is coupled to the first node between the first transistor and the third constant current source, the second node between the second transistor and the fourth current source, and the second constant current source;

a second current mirror that is coupled to the first and second constant current sources and that is coupled to the third differential pair of transistors; and a third current mirror that is coupled to the second current mirror and the third differential pair of transistors.

5. The apparatus of claim 4, wherein the input circuit further comprises first and second output terminals, and wherein the apparatus further comprises:

a gain circuit that is coupled to the first and second output terminals; and an output circuit that is coupled to the gain circuit.

6. The apparatus of claim 5, wherein the first and second transistors further comprise first and second MOS transistors, and wherein the first differential pair of transistors further comprises a differential pair of MOS transistors, and wherein the second differential pair of transistors further comprises a first differential pair of bipolar transistors, and wherein the third differential pair of transistors further comprises a second differential pair of bipolar transistors.

* * * * *